United States Patent
Lin

(10) Patent No.: US 8,400,152 B2
(45) Date of Patent: Mar. 19, 2013

(54) METHOD FOR K-SPACE RECONSTRUCTION IN MAGNETIC RESONANCE INVERSE IMAGING

(76) Inventor: Fa-Hsuan Lin, Brookline, MA (US)

( * ) Notice: Subject to any disclaimer, the term of this patent is extended or adjusted under 35 U.S.C. 154(b) by 366 days.

(21) Appl. No.: 12/762,922

(22) Filed: Apr. 19, 2010

(65) Prior Publication Data

US 2011/0254549 A1    Oct. 20, 2011

(51) Int. Cl.
*G01V 3/00* (2006.01)
(52) U.S. Cl. ........................................ 324/309
(58) Field of Classification Search ........... 324/300–322
See application file for complete search history.

(56) References Cited

U.S. PATENT DOCUMENTS

| | | | | |
|---|---|---|---|---|
| 7,309,984 B2 * | 12/2007 | Arunachalam et al. | ....... | 324/307 |
| 7,397,242 B2 * | 7/2008 | Samsonov et al. | ............ | 324/309 |
| 7,840,045 B2 * | 11/2010 | Guo et al. | ...................... | 382/128 |
| 8,089,278 B1 * | 1/2012 | Du | ................. | 324/307 |
| 8,116,541 B2 * | 2/2012 | Brau et al. | .................... | 382/128 |
| 8,184,879 B2 * | 5/2012 | Geier et al. | .................... | 382/128 |
| 8,194,937 B2 * | 6/2012 | Chen | ............................. | 382/118 |

* cited by examiner

*Primary Examiner* — Dixomara Vargas
(74) *Attorney, Agent, or Firm* — Bacon & Thomas, PLLC

(57) ABSTRACT

A method for parallel magnetic resonance imaging ("pMRI") that does not require the explicit estimation of a coil sensitivity map is provided. Individual coil images are reconstructed from undersampled scan data that is acquired with a radio frequency (RF) coil array having multiple coil channels. An inverse operator is formed from autocalibration scan (ACS) data, and is applied to the acquired scan data in order to produce reconstruction coefficients. Missing k-space lines in the undersampled scan data are synthesized by interpolating k-space lines in the acquired scan data using the reconstruction coefficients. From the acquired scan data and the synthesized missing k-space lines, individual coil images are reconstructed and combined to form an image of the subject.

19 Claims, 5 Drawing Sheets

METHOD FOR K-SPACE RECONSTRUCTION IN MAGNETIC RESONANCE INVERSE IMAGING

STATEMENT REGARDING FEDERALLY SPONSORED RESEARCH

This invention was made with United States government support awarded by the following agency: National Institute of Health, NIH EB007298 and RR14075. The United States government has certain rights in this invention.

BACKGROUND OF THE INVENTION

The field of the invention is systems and methods for magnetic resonance imaging ("MRI"). More particularly, the invention relates to systems and methods for parallel MRI data acquisition and image reconstruction.

MRI uses the nuclear magnetic resonance ("NMR") phenomenon to produce images. When a substance such as human tissue is subjected to a uniform magnetic field (polarizing field $B_0$), the individual magnetic moments of the nuclei in the tissue attempt to align with this polarizing field, but precess about it at their characteristic Larmor frequency. If the substance, or tissue, is subjected to a radio frequency ("RF") magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction.

In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

Depending on the technique used, many MR scans currently require many minutes to acquire the necessary data used to produce medical images. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel MRI" ("pMRI"). Parallel MRI techniques use spatial information from arrays of radio frequency ("RF") receiver coils to substitute for the spatial encoding that would otherwise have to be obtained in a sequential fashion using RF pulses and magnetic field gradients, such as phase and frequency encoding gradients. Each of the spatially independent receiver coils of the array carries certain spatial information and has a different spatial sensitivity profile. This information is utilized in order to achieve a complete spatial encoding of the received MR signals, for example, by combining the simultaneously acquired data received from each of the separate coils. Parallel MRI techniques allow an undersampling of k-space, in general, by reducing the number of acquired phase-encoded k-space sampling lines, while keeping the maximal extent covered in k-space fixed. The combination of the separate MR signals produced by the separate receiver coils enables a reduction of the acquisition time required for an image, in comparison to a conventional k-space data acquisition, by a factor related to the number of the receiver coils. Thus the use of multiple receiver coils acts to multiply imaging speed, without increasing gradient switching rates or RF power.

Two categories of such parallel imaging techniques that have been developed are the so-called "image space methods" and "k-space methods." An exemplary image space method is known in the art as sensitivity encoding ("SENSE"), while an exemplary k-space method is known in the art as simultaneous acquisition of spatial harmonics ("SMASH"). With SENSE, the undersampled k-space data is first Fourier transformed to produce an aliased image from each coil, and then the aliased image signals are unfolded by a linear transformation of the superimposed pixel values. With SMASH, the omitted k-space lines are synthesized or reconstructed prior to Fourier transformation, by constructing a weighted combination of neighboring k-space lines acquired by the different receiver coils. SMASH requires that the spatial sensitivity of the coils be determined, and one way to do so is by "autocalibration" that entails the use of variable density k-space sampling.

A more recent advance to the SMASH technique that uses autocalibration is a technique known as generalized autocalibrating partially parallel acquisitions ("GRAPPA"). With GRAPPA, k-space lines near the center of k-space are sampled at the Nyquist frequency, while k-space lines in the peripheral regions of k-space are acquired with a degree of undersampling. The center k-space lines are referred to as so-called autocalibration signal ("ACS") lines, which are used to determine weighting factors that are utilized to synthesize, or reconstruct, the missing k-space lines. In particular, a linear combination of individual coil data is used to create the missing lines of k-space. The coefficients for the combination are determined by fitting the acquired data to the more highly sampled data near the center of k-space.

Image reconstruction from data acquired with pMRI techniques may require an implicit or explicit estimation of the sensitivity profile, or "map," of the RF coil elements used to acquire the data. However, accurate coil sensitivity map estimation is practically difficult. Indeed, errors in the estimated coil sensitivity maps can propagate to the reconstructed images. To mitigate this challenge, ACS lines can be utilized, such as those used in GRAPPA and other methods such as AUTO-SMASH and PILS. These methods empirically measure a small portion of the fully gradient-encoded data in order to estimate the necessary coefficients to reconstruct, or synthesize," missing data in the accelerated scans. The coil sensitivity information embedded in the ACS lines is implicitly used in the image reconstruction. Therefore, the reconstructed images are more robust to errors related to performing an explicit estimation of the coil sensitivity maps. Furthermore, GRAPPA and PILS can achieve coil-by-coil image reconstructions. Individual coil images can then be later combined in different ways to achieve the optimal performance.

In general, increasing the number of channels in an RF coil array can further improve the spatiotemporal resolution achievable with pMRI techniques. Previously, magnetic resonance inverse imaging ("InI") was developed to achieve ultra-fast functional MRI ("fMRI") of the human brain during the performance of functional tasks as described, for example, in U.S. Pat. No. 7,394,251, which is herein incorporated by reference in its entirety.

Mathematically, InI generalizes pMRI reconstructions from an over-determined linear system to an under-determined linear system in order to reduce the time required for k-space traversal and, therefore, to achieve a significant improvement in temporal resolution. Previous InI reconstructions employed minimum-norm estimates ("MNE") or linear-constraint minimum variance ("LCMV") beamformer spatial filtering in image space. These two methods can be viewed as the generalization of the SENSE pMRI technique with minimally gradient-encoded data. To reveal relative changes in task-related fMRI using the so-called "in vivo sensitivity" approach described by (Sodickson, 2000), coil sensitivity maps can be empirically measured by collecting fully gradient-encoded data. However, individual coil images cannot be reconstructed at each time instant in the InI acquisition since an explicit coil sensitivity map is not measured.

SUMMARY OF THE INVENTION

The present invention overcomes the aforementioned drawbacks by providing a method for parallel magnetic resonance imaging ("pMRI") that does not require the explicit estimation of a coil sensitivity map, and in which individual coil images are reconstructed from undersampled scan data that is acquired with a radio frequency ("RF") coil array having multiple coil channels. These k-space lines not sampled in the undersampled k-space data are synthesized using auto-calibration scan ("ACS") data and data acquired in the undersampled scan data set. More particularly, an inverse operator is formed from the ACS data and applied to the acquired scan data in order to produce reconstruction coefficients. The missing k-space lines are synthesized by interpolating k-space lines in the acquired scan data and using the reconstruction coefficients. From the acquired scan data and the synthesized missing k-space lines, individual coil images are reconstructed and combined to form an image of the subject.

It is an aspect of the invention to provide a method for accelerated volumetric functional MRI ("fMRI") with high temporal resolution. An image volume is reconstructed for each time frame during the fMRI scan. Thus, the volumetric spatial distribution of dynamic changes of brain activity and the associated statistical inference are provided.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
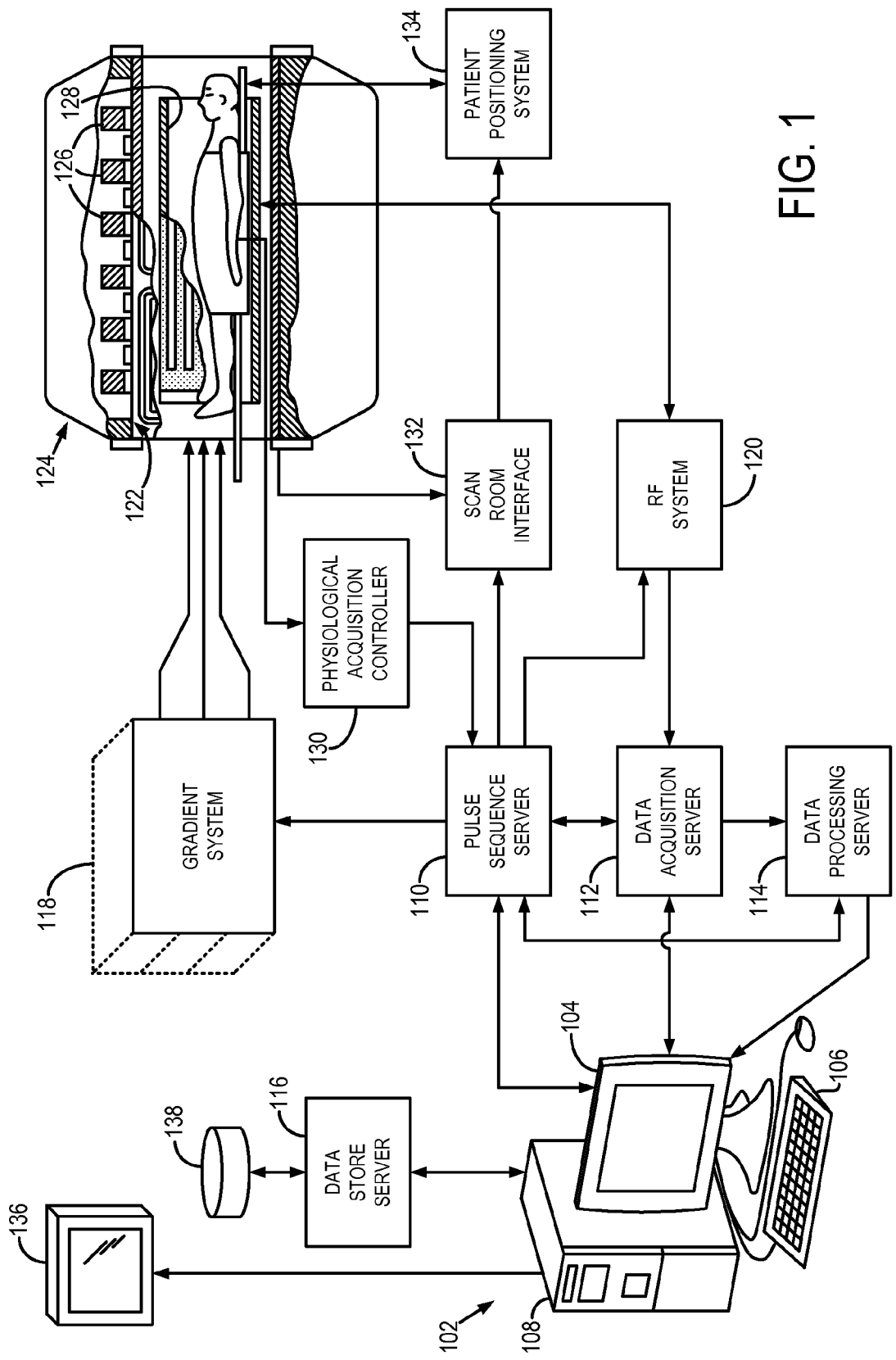
FIG. 1 is a block diagram of an exemplary magnetic resonance imaging ("MRI") system that employs the present invention.

Referring particularly to FIG. 1, the preferred embodiment of the invention is employed in a magnetic resonance imaging ("MRI") system 100. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad \text{Eqn. (1);}$$

and the phase of the received MR signal may also be determined:

$$\phi = \tan^{-1}\left(\frac{Q}{I}\right). \qquad \text{Eqn. (2)}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
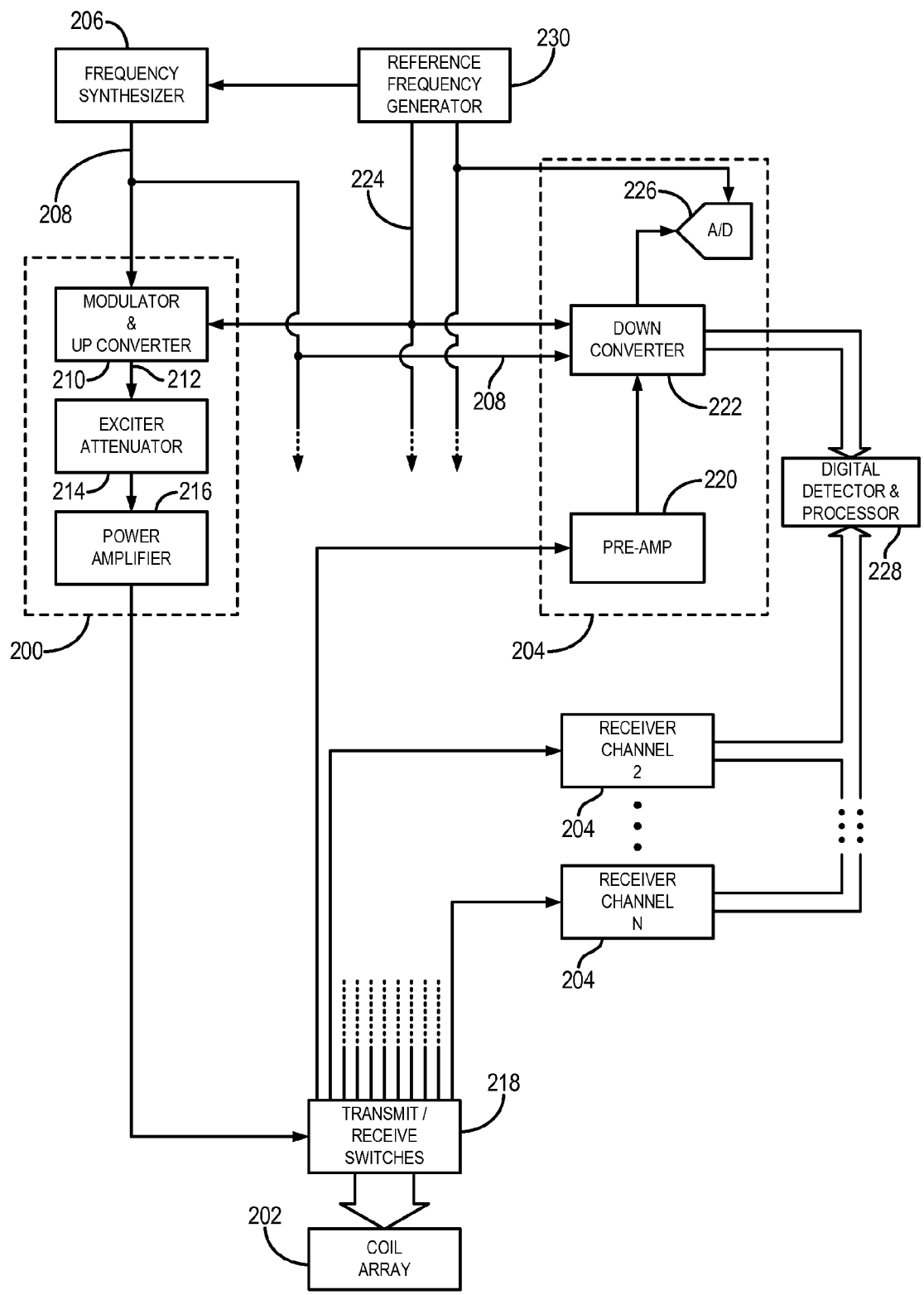
FIG. 2 is a block diagram of an exemplary radio frequency ("RF") system that forms a part of the MRI system of FIG. 1.

As shown in FIG. 1, the radiofrequency ("RF") system 120 may be connected to the whole body RF coil 128, or as shown in FIG. 2, a transmitter section of the RF system 120 may connect to at least one transmit channel 200 of a coil array 202, and its receiver section may connect to at least one receiver channel 204 of the coil array 202. Often, the transmitter section is connected to the whole body RF coil 128 or a local transmit coil (not shown), and, in so-called "parallel receiver" coil arrays, each receiver section is connected to a separate receiver channel 204. For example, the RF coil array includes 8, 16, 32, or more receiver coil elements.

Referring particularly to FIG. 2, the RF system 120 includes a transmitter that produces a prescribed RF excitation field. The base, or carrier, frequency of this RF excitation field is produced under control of a frequency synthesizer 206 that receives a set of digital signals from the pulse sequence server 110. These digital signals indicate the frequency and phase of the RF carrier signal produced at an output 208. The RF carrier is applied to a modulator and up converter 210 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 212 is attenuated by an exciter attenuator circuit 214 that receives a digital command from the pulse sequence server 110. The attenuated RF excitation pulses are applied to a power amplifier 216, which drives the RF coil array 202 through a transmit/receive ("T/R") switch 218.

Referring still to FIG. 2, the signal produced by the subject is picked up by the coil array 202 and applied to the inputs of a set of receiver channels 204. A pre-amplifier 220 in each receiver channel 204 amplifies the signal by an amount determined by a digital attenuation signal received from the pulse sequence server 110. The received signal is at or around the Larmor frequency, and this high frequency signal is down-converted in a two step process by a down converter 222, which first mixes the detected signal with the carrier signal on line 208 and then mixes the resulting difference signal with a reference signal on line 224. The down converted MR signal is applied to the input of an analog-to-digital ("A/D") converter 226 that samples and digitizes the analog signal and applies it to a digital detector and signal processor 228 that produces 16-bit in-phase (I) values and 16-bit quadrature (Q) values corresponding to the received signal. The resulting stream of digitized I and Q values of the received signal are output to the data acquisition server 112. The reference signal, as well as the sampling signal applied to the A/D converter 226, are produced by a reference frequency generator 230.

Figure 3A:
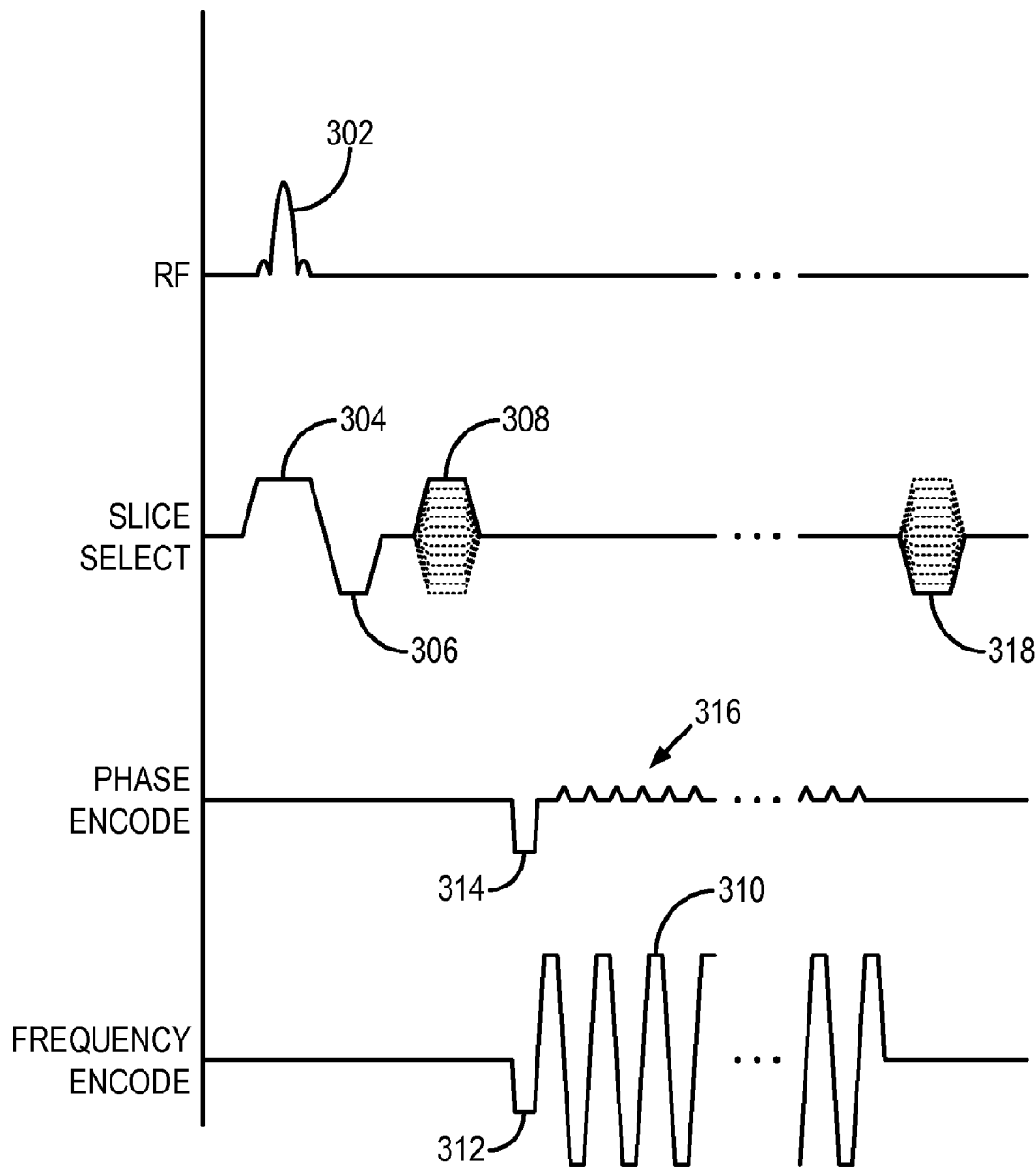
FIG. 3A is a timing diagram of an exemplary pulse sequence employed to acquire reference scan data in accordance with the present invention.

An exemplary pulse sequence employed to direct the MRI system to acquire reference scan data in accordance with the present invention is illustrated in FIG. 3A. Such an exemplary pulse sequence is a gradient-recalled echo planar imaging ("EPI") pulse sequence. The pulse sequence includes a spatially selective radio frequency ("RF") excitation pulse 302 that is played out in the presence of a slab-selective gradient 304 in order to produce transverse magnetization in a prescribed imaging slab. By way of example, the RF excitation pulse 302 is applied with a flip angle of 30 degrees, and the prescribed imaging slab is a thick coronal slab covering substantially the entire brain. The slab-selective gradient 304 includes a rephasing lobe 306 that acts to rephase unwanted phase dispersions introduced by the slab-selective gradient 304, such that signal losses resultant from these phase dispersions are mitigated.

Following excitation of the nuclear spins in the prescribed imaging slab, a partition within the imaging slab is selected for data acquisition through the application of a partition encoding gradient 308. Image data is then acquired by sampling a series of gradient-recalled echo signals in the presence of an alternating readout gradient 310. The alternating readout gradient is preceded by the application of a pre-winding gradient 312 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 314, which are each played out in between the successive signals readouts such that each echo signal is separately phase encoded. The phase encoding gradient blips 314 are preceded by the application of a pre-winding gradient 316 that acts to move the first sampling point along the phase-encoding direction a distance $\Delta k_y$ in k-space. Together, the pre-winding gradients 312 and 316 serve to begin the sampling of k-space at a defined k-space location $(k_x, k_y)$. After the application of the alternating readout gradient 310, a rewinder gradient 318 is applied along the slab-encoding direction in order to rephase remaining transverse magnetization in preparation for subsequent repetitions of the pulse sequence.

As is well known in the art, the pulse sequence is repeated a plurality of times while stepping through different values of the partition encoding gradient 308 and associated rewinder gradient 318 such that reference data is acquired from a plurality partitions contained within the prescribed imaging slab.

Figure 3B:
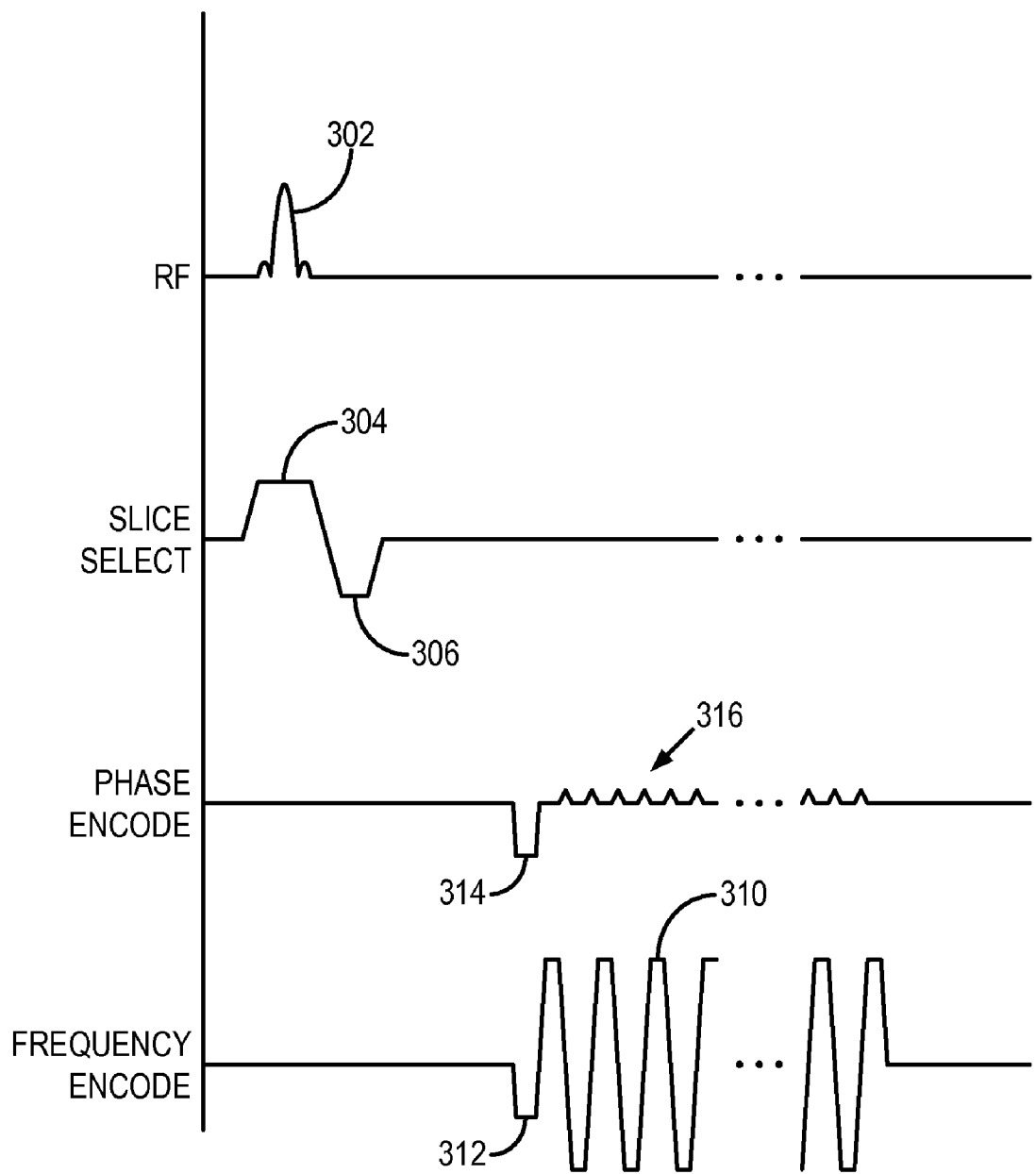
FIG. 3B is a timing diagram of an exemplary pulse sequence employed to acquire functional scan data in accordance with the present invention.

Referring now to FIG. 3B, an exemplary pulse sequence employed to direct the MRI system to acquire functional scan data in accordance with the present invention is illustrated. The functional data is acquired from a subject while the subject is performing a functional task, such as the exemplary functional task described below. This functional scan is similar to reference scan, except no partition-encoding gradients or rewinder gradients are applied during. Thus, data is acquired from the entire prescribed imaging slab during the application of the alternating readout gradient 310. By way of example, when the prescribed imaging slab is a thick coronal slab, the functional data is acquired as a coronal X-Z projection, in which spatial information is collapsed along the anterior-posterior direction.

When it is desirable to achieve a steady state prior to data acquisition, a selected number of so-called "dummy scans" are performed. For example, 2400 measurements are acquired following thirty-two dummy scan measurements in order to reach the longitudinal magnetization steady state.

Similar to other k-space based pMRI reconstruction techniques, the k-space InI ("K-InI") reconstruction begins with the estimation of reconstruction coefficients, or "kernels," based on acquired ACS data. Subsequently, these coefficients are used as weightings that are applied to the acquired under-sampled scan data in order to interpolate the missing k-space lines.

Specifically, image reconstruction methods for pMRI that operate predominantly in k-space, such as GRAPPA, generally estimate those k-space samples not acquired in the accelerated scan using linear interpolation from other k-space samples acquired in the accelerated scan. Without the loss of generality, the GRAPPA formulation can be established to express the not-acquired k-space data $y_j^{ACC}(k+m\cdot\Delta k)$ with phase encoding $k_y=k+m\cdot\Delta k$ from the $j^{th}$ coil channel as a linear combination of the acquired k-space data with $k_y=k$ from all channels in the accelerated acquisition:

$$y_j^{ACC}(k+m\cdot\Delta k) = \sum_{c=1}^{n_c} y_c^{ACC}(k)\beta_{c,j,m} \text{ with } j=1,\cdots,n_c; \quad \text{Eqn. (3)}$$

where $n_c$ is the total number of channels in the coil array; $\beta_{c,j,m}$ is the unknown reconstruction coefficient for the $c^{th}$ coil channel to estimate the data in the $j^{th}$ channel with phase encoding $m\cdot\Delta k$; and $\Delta k$ is the minimal separation in the phase encoding direction, $k_y$, defined by the field-of-view ("FOV"), spatial resolution, and the Nyquist sampling theorem.

Importantly, Eqn. (3) describes the linear relationship between data with different phase encodings within a vicinity, which contains a "block" in GRAPPA. For example, a block of four describes the relationship between any four consecutive phase encoding lines using Eqn. (3) with m ranging between 1-3. One feature of GRAPPA is that if some data identified on both the left-hand and the right-hand sides of Eqn. (3) are acquired for some blocks, $\beta_{c,j,m}$ can be estimated via optimizing the residuals of Eqn. (3). Subsequently, $\beta_{c,j,m}$ can be used to interpolate the not-acquired k-space data in other blocks where data on the right-hand side of Eqn. (3) are not acquired in the accelerated scan. The data on both the left-hand and right-hand sides of Eqn. (3) used for estimating the reconstruction coefficients is the so-called ACS data. Thus, $$y_j^{ACS}(k+m\cdot\Delta k) = \sum_{c=1}^{n_c} y_c^{ACS}(k)\beta_{c,j,m} \text{ with } j=1,\cdots,n_c; \quad \text{Eqn. (4)}$$

Collecting all data in different frequency-encoding steps and all channels in the coil array, Eqns. (3) and (4) can be rewritten using matrices and vectors as follows:

$$y_{j,m}^{ACC} = A^{ACC}\beta_{j,m} \quad \text{Eqn. (5);}$$

and $$y_{j,m}^{ACS} = A^{ACS}\beta_{j,m} \quad \text{Eqn. (6).}$$

In practice, $y_{j,m}^{ACS}$ and $A^{ACS}$ are first empirically measured to estimate $\beta_{j,m}$, which are then multiplied with $A^{ACC}$ constructed from the collected data in the accelerated scan to reconstruct the missing data, $y_{j,m}^{ACC}$. As the number of channels in a RF coil array increases, the matrices $A^{ACS}$ and $A^{ACC}$ will grow horizontally. However, data with different frequency encodings can be included as independent measurements in Eqn. (6) and usually a few blocks are used in the auto-calibrating scans. Thus $y_{j,m}^{ACS}$ and $A^{ACS}$ will also grow vertically as the results of data concatenation. Overall, Eqn. (6) usually represents an over-determined linear system as the results of a "long" (i.e., more rows than columns) $A^{ACS}$. Subject to a constraint, such as minimal residual power error, the reconstruction coefficients $\beta_{j,m}$ can be estimated uniquely.

The InI acquisition achieves significant acceleration by collecting minimal k-space data, such as one phase encoding line, using an RF coil array with a large number of coil elements, for example, 32 or more. Therefore, the matrix $A^{ACS}$ in Eqn. (6) is no longer a "long" matrix, but a "wide" (i.e., more columns than rows) matrix, because InI usually uses a coil array with many channels, and a block including all phase-encodings is collected in the auto-calibrating scan. This translates the estimation of $\beta_{j,m}$ from an over-determined linear system to an under-determined linear system. The values of $\beta_{j,m}$ cannot be uniquely determined using a constraint of minimizing the residual power. Since there is an infinite number of sets of solutions satisfying the forward problem, additional constraints must be imposed in order to obtain a unique solution. However, another constraint can be imposed, such as, for example, minimizing the power of the reconstruction coefficients, in order to estimate $\beta_{j,m}$. This constraint is beneficial because it gives a stable solution in an analytic form.

Thus, the constrained minimization has the following form:

$$\hat{\beta}_{j,m} = \underset{\beta_{j,m}}{\operatorname{argmin}}\{\|y_{j,m}^{ACC} - A^{ACC}\beta_{j,m}\|_2^2 + \lambda\|\beta_{j,m}\|_2^2\}; \quad \text{Eqn. (7)}$$

which can be solved analytically through, $$\hat{\beta}_{j,m} = (A^{ACC})^H \cdot ((A^{ACC})^H A^{ACC} + \lambda C)^{-1} y_{j,m}^{ACC} \quad \text{Eqn. (8);}$$

where $\|\ldots\|_2$ is the $l_2$-norm, $(\ldots)^H$ is the complex conjugate and transpose operation (Hermitian operator), C is the noise covariance matrix among different channels in the coil array, and $\lambda$ is a regularization parameter. The regularization parameter, $\lambda$, can be reasonably estimated from the pre-specified signal-to-noise ratio ("SNR") of the measurement through, $$\lambda = \frac{Tr((A^{ACC})^H A^{ACC})}{Tr(C) \cdot SNR^2}; \quad \text{Eqn. (9)}$$

where $Tr(\ldots)$ represents the trace of the matrix. This is similar to the minimum-norm estimate ("MNE") of the InI data; however, the reconstruction is now performed in k-space directly without involving explicit coil sensitivity estimates.

Estimating the reconstruction coefficients, $\beta_{j,m}$, in Eqn. (8) requires a regularization parameter, $\lambda$, during the derivation of the inverse operator. This requirement exists because the matrix $(A^{ACC})^H A^{ACC}$ can be rank deficient resulting from too few channels, or less independent spatial sensitivity information provided by the coil array. A rank-deficient $(A^{ACC})^H A^{ACC}$ matrix prohibits the calculation of the coefficients in Eqn. (8) since the necessary matrix inversion does not exist. To address this issue, a fully ranked noise covariance matrix is introduced as a remedy for the rank deficiency. Eqn. (9) uses an empirical formula to estimate the regularization parameter; however, it should be apparent to those skilled in the are that alternative methods for calculating the regularization parameter exist. For example, an L-curve or generalized cross validation method can be employed to estimate different regularization parameters, $\lambda$.

Provided with the estimated $\hat{\beta}_{j,m}$ and empirically collected $A^{ACC}$ in the accelerated scan, the missing data, $y_{j,m}^{ACC}$, can be reconstructed sequentially for individual channels and individual $m \cdot \Delta k$ in the phase encoding direction using Eqn. (5). The combined image can thus be calculated using the sum-of-squares:

$$X_{K-InI} = \sqrt{\sum_{j=1}^{n_c} |FT\{y_j\}|^2} ; \quad \text{Eqn. (10)}$$

where $FT\{\ldots\}$ denotes the discrete Fourier transform.

The K-InI reconstruction technique provides a method for reconstructing individual coil images that include both phase and magnitude information. The phase information can be crucial for other applications, such as, for example, spectroscopic imaging. In spectroscopic imaging, repetitive measurements are required to collect off-resonance free induction decays from different metabolites or macromolecules. In these spectroscopic imaging applications, K-InI provides a method for reasonable reconstruction.

The K-InI technique also provides a method for image reconstruction from individual coils. However, the coil-by-coil reconstruction can be computationally demanding because the amount of calculation is directly related to the number of channels in the RF coil array. As the number of channels in the RF coil array increases from the conventional 8 to 12, 32, and even 96 channels, this computation can be particularly demanding. This technical challenge can be partially mitigated using an array compression technique, in which from a few linear combinations of channels in the array, referred to as modes, spatial information can be effectively preserved, while the total number of "channels" can be reduced dramatically. This result can provide a significant improvement in the computational efficiency of the K-InI technique.

Figure 4:
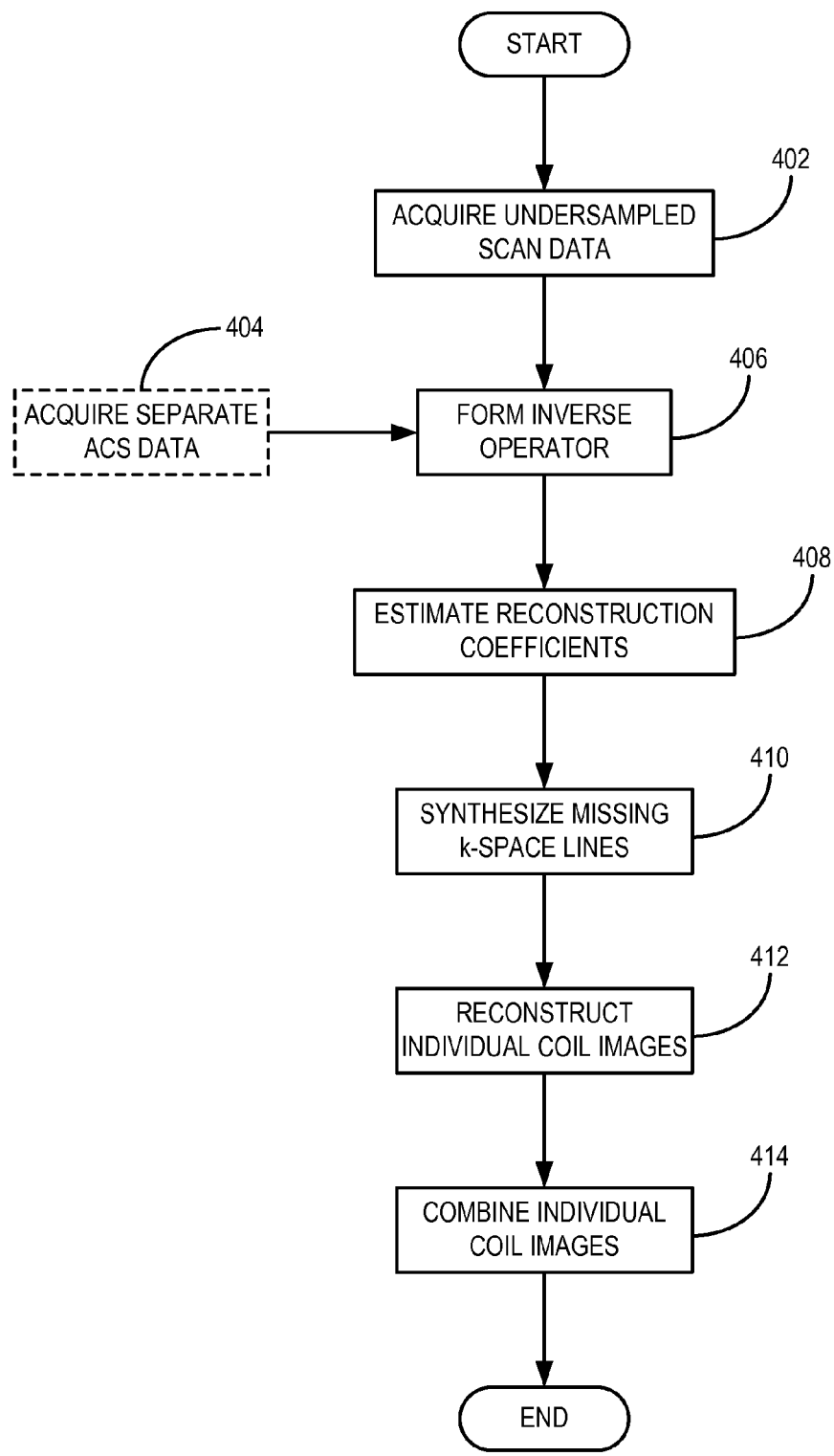
FIG. 4 is a flowchart setting forth the steps of an exemplary method for producing an image of a subject in accordance with the present invention.

Referring now to FIG. 4, a flowchart setting forth the steps of an exemplary method for reconstructing an image of a subject from undersampled scan data using a k-space inverse imaging ("K-InI") technique is illustrated. The method begins by acquiring the undersampled scan data, from which the image of the subject is to be reconstructed, as indicated at step 402. This acquired undersampled scan data can include a portion of auto-calibration scan ("ACS") data that is represented as a substantially fully sampled portion of k-space. In the alternative, however, ACS data can optionally be acquired in a separate scan, as indicated at step 404. For example, the ACS data can be reference scan data acquired using the pulse sequence described above with respect to FIG. 3A.

An inverse operator is formed next, as indicated at step 406. This inverse operator is formed, for example, in accordance with Eqn. (8) described above. By way of example, the inverse operator may be formed by performing a singular value decomposition on the encoding matrix, $A^{ACC}$, and truncating a portion of a combination of singular vectors and singular values included in the singular value decomposition of the encoding matrix, $A^{ACC}$. After the inverse operator is formed, it is applied to the acquired undersampled scan data in order to estimate the reconstruction coefficients, $\hat{\beta}_{j,m}$, as indicated at step 408. The reconstruction coefficients are then used to synthesize the missing k-space lines that were not sampled in the undersampled scan data, as indicated at step 410. For example, the missing k-space lines are interpolated using the acquired undersampled scan data and the reconstruction coefficients.

Using the synthesized missing k-space lines and the acquired undersampled scan data, images for each of the individual coil channels are reconstructed, as indicated at step 412. These individual coil images are then combined to form an image of the subject, as indicated at step 414. For example, the sum-of-squares combination in Eqn. (10) is implemented.

The present invention has been described in terms of one or more preferred embodiments, and it should be appreciated that many equivalents, alternatives, variations, and modifications, aside from those expressly stated, are possible and within the scope of the invention. For example, LCMV spatial filtering can be applied to estimate the reconstruction coefficients, $\hat{\beta}_{j,m}$, in Eqns. (5) and (6). It is also contemplated that so-called "k-t" sampling methods can be implemented with the K-InI technique, similar to how methods such as k-t GRAPPA are implemented. Moreover, it is contemplated that compressed sensing techniques can be implemented, for example, by replacing the $l_2$-norm in Eqn. (7) with an $l_1$-norm.

The invention claimed is:

1. A method for reconstructing an image of a subject with a magnetic resonance imaging (MRI) system that includes a radio frequency (RF) coil array having multiple coil channels, the steps of the method comprising:
   a) acquiring, with the MRI system and from the subject, undersampled scan data defining a set of k-space lines including sampled k-space lines and unsampled k-space lines;
   b) acquiring, with the MRI system and from the subject, auto-calibration scan (ACS) data;
   c) estimating k-space line data for the unsampled k-space lines from an under-determined linear system that includes the ACS data and the undersampled scan data to produce a set of synthesized k-space lines corresponding to the unsampled k-space lines; and
   d) reconstructing an image of the subject using the synthesized k-space lines and the acquired scan data.

2. The method as recited in claim 1 in which the under-determined linear system includes at least one of a matrix having more columns than rows and a rank-deficient matrix.

3. The method as recited in claim 2 in which the RF coil array includes at least two coil channels.

4. The method as recited in claim 1 in which steps a) and b) are performed substantially contemporaneously and the ACS data acquired in step b) forms a part of the undersampled scan data acquired in step a).

5. The method as recited in claim 1 in which the ACS data acquired in step b) is acquired as reference scan data by performing a pulse sequence that substantially fully samples a desired field-of-view.

6. The method as recited in claim 1 further comprising reconstructing an individual coil image for each coil in the coil array from the synthesized k-space lines and the acquired scan data.

7. The method as recited in claim 6 in which the individual coil images include both magnitude and phase information.

8. The method as recited in claim 6 in which step d) includes forming the image of the subject by combining the reconstructed individual coil images.

9. The method as recited in claim 8 in which combining the reconstructed individual coil images includes performing a sum-of-squares combination of the reconstructed individual coil images.

10. The method as recited in claim 1 in which step c) includes forming an inverse operator using the ACS data, the inverse operator including information related to the unsampled k-space lines.

11. The method as recited in claim 10 in which the formed inverse operator includes at least one of a regularization parameter and a regularization matrix.

12. The method as recited in claim 11 in which the regularization matrix includes at least one of an identity matrix and a noise covarianve matrix of the RF coil array.

13. The method as recited in claim 11 in which the regularization parameter is estimated using a relative proportion between a trace of the regularization matrix and a trace of a matrix multiplication between a Hermitian transpose of an encoding matrix and the encoding matrix, the encoding matrix containing information related to the undersampled scan data.

14. The method as recited in claim 11 in which the regularization parameter is estimated using at least one of an L-curve method and a generalized cross-validation method.

15. The method as recited in claim 10 in which forming the inverse operator includes performing a singular value decomposition on an encoding matrix that includes information related to the undersampled scan data; and truncating a portion of a combination of singular vectors and singular values included in the singular value decomposition of the encoding matrix.

16. The method as recited in claim 10 in which forming the inverse operator includes providing an analytical solution to a constrained minimization of reconstruction coefficients used to estimate the unsampled k-space lines.

17. The method as recited in claim 16 in which the constrained minimization constrains the power of the reconstruction coefficients.

18. The method as recited in claim 10 in which step c) further includes applying the inverse operator to the acquired scan data in order to estimate reconstruction coefficients.

19. The method as recited in claim 18 in which step c) further includes synthesizing the synthesized k-space lines using the reconstruction coefficients.

* * * * *